United States Patent
Jiang et al.

(10) Patent No.: US 12,224,035 B1
(45) Date of Patent: Feb. 11, 2025

(54) DEVICE FOR RECEIVING SINGLE-ENDED SIGNAL OF LIGHT EMITTING DIODE CONTROL CARD AND FORWARDING AS DIFFERENTIAL SIGNALS

(71) Applicant: Valley Microelectronics, Inc., Kunshan (CN)

(72) Inventors: Lifeng Jiang, Kunshan (CN); Gufeng Xi, Kunshan (CN)

(73) Assignee: Valley Microelectronics, Inc., Kunshan (CN)

( * ) Notice: Subject to any disclaimer, the term of this patent is extended or adjusted under 35 U.S.C. 154(b) by 0 days.

(21) Appl. No.: 18/911,618

(22) Filed: Oct. 10, 2024

(30) Foreign Application Priority Data

Dec. 27, 2023 (CN) .......................... 202311817202.0

(51) Int. Cl.
  *G11C 11/415* (2006.01)
  *G11C 7/08* (2006.01)
  *G11C 7/22* (2006.01)

(52) U.S. Cl.
  CPC ............ *G11C 7/08* (2013.01); *G11C 7/227* (2013.01); *G11C 11/415* (2013.01)

(58) Field of Classification Search
  CPC .......... G11C 7/227; G11C 7/08; G11C 11/415
  USPC ....................................................... 365/207
  See application file for complete search history.

(56) References Cited

U.S. PATENT DOCUMENTS

| | | | | |
|---|---|---|---|---|
| 7,259,734 B2* | 8/2007 | Lim | ........................ | G09G 3/32 345/82 |
| 2004/0164936 A1* | 8/2004 | Lim | ..................... | G06F 3/1446 345/76 |
| 2007/0040764 A1* | 2/2007 | Kim | ..................... | G09G 3/3291 345/30 |
| 2013/0127923 A1* | 5/2013 | An | ..................... | G09G 3/3233 345/690 |

(Continued)

FOREIGN PATENT DOCUMENTS

| | | |
|---|---|---|
| CN | 207529636 U | 6/2018 |
| CN | 111063318 A | 4/2020 |
| CN | 112583416 A | 3/2021 |

(Continued)

OTHER PUBLICATIONS

First Office Action for China Application No. 202311817202.0, mailed Jun. 11, 2024.

(Continued)

*Primary Examiner* — Sung Il Cho
(74) *Attorney, Agent, or Firm* — Pilloff Passino & Cosenza LLP; Rachel Pilloff; Sean Passino

(57) ABSTRACT

The disclosure provides a device for receiving a single-ended signal of an LED control card and forwarding as differential signals, including a parsing unit, a control unit, an SRAM and a differential output unit; the parsing unit is used for receiving and parsing data, latch and clock signals sent by the control card; the SRAM is used for storing display data of a parsing result; the control unit is used for processing commands of the parsing result, accessing the SRAM, modifying the display data transmitted by the pars- (Continued)

ing unit in the SRAM, and filling the SRAM for provision to a back end for output display; and the differential output unit is used for obtaining differential signals based on a processing result of the control unit.

3 Claims, 7 Drawing Sheets

(56) References Cited

U.S. PATENT DOCUMENTS

2019/0303042 A1* 10/2019 Kim .................. H01L 25/18

FOREIGN PATENT DOCUMENTS

| | | |
|---|---|---|
| CN | 113852775 A | 12/2021 |
| CN | 115604417 A | 1/2023 |
| WO | 2004072931 A1 | 8/2004 |

OTHER PUBLICATIONS

Notification to Grant Patent for China Application No. 202311817202.0, mailed Jul. 25, 2024.
First Search Report for China Application No. 202311817202.0, dated Jun. 6, 2024.
Supplementary Search Report for China Application No. 202311817202.0, dated Jul. 18, 2024.

* cited by examiner

DEVICE FOR RECEIVING SINGLE-ENDED SIGNAL OF LIGHT EMITTING DIODE CONTROL CARD AND FORWARDING AS DIFFERENTIAL SIGNALS

CROSS-REFERENCE TO RELATED APPLICATIONS

This application claims priority to Chinese Patent Application No. 202311817202.0, filed on Dec. 27, 2023, the contents of which are hereby incorporated by reference.

TECHNICAL FIELD

The disclosure relates to the technical field of conversion circuits, and particularly relates to a device for receiving a single-ended signal of a light emitting diode (LED) control card and forwarding as differential signals.

BACKGROUND

The current LED display system uses a single-ended signal (incapable of exceeding 20 megahertz (MHz)) to connect a controller and an LED module. The driver chip on the LED module needs to integrate a certain capacity of static random-access memory (SRAM) and phase locked loop (PLL) to save data sent by a control card and generate a high-frequency display clock for display refresh. The new display system requires the use of differential signals to connect the controller and LED module. Due to the high-frequency transmission characteristics of differential signals (easily exceeding 200 MHZ), the driver chip no longer needs SRAM to save data and PLL to generate high-frequency display clock, thus saving a lot of cost. However, connecting line signals are not compatible with the existing control card.

SUMMARY

To address the shortcomings of the prior art, the disclosure provides a device for receiving a single-ended signal of an LED control card and forwarding as differential signals, realizing compatibility between a control card and differential column driver chips by adding a receiving module between the control card and the differential column driver chips.

In order to achieve the above objective, the disclosure provides a following scheme:

a device for receiving a single-ended signal of an LED control card and forwarding as differential signals, including a parsing unit, a control unit, an SRAM and a differential output unit;

the parsing unit is respectively connected with the control unit, the SRAM and the differential output unit, the control unit is respectively connected with the SRAM and the differential output unit, and the SRAM is connected with the differential output unit;

the parsing unit is used for receiving and parsing data, latch and clock signals sent by the control card;

the SRAM is used for storing display data of a parsing result;

the control unit is used for processing commands of the parsing result, accessing the SRAM, modifying the display data transmitted by the parsing unit in the SRAM, and filling the SRAM for provision to a back end for output display; and the differential output unit is used for obtaining differential signals based on a processing result of the control unit.

Optionally, the parsing unit divides the SRAM into two caches, and there is an address pointer inside the SRAM; when reset, the pointer points to 0, cache 0; when a DATA_LATCH command is received, 16 bit*3 or 16 bit*6 pieces of data are written to corresponding addresses of the SRAM, and an address counter automatically increments by 6/12 bytes after writing the data; after a VSYNC command is received, the address pointer is reset to 0, pointing to cache 1; caches are written alternately, and no more writing is conducted when the caches are full.

Optionally, the control unit includes three groups of registers, 64 in each group, and each register is 8 bit in size; when the parsing unit receives a PRE_ACT command and a WR_REG command, values are written into registers of corresponding addresses, and an interrupt is generated to a core of the control unit during writing;

the control unit also includes two 32 bit registers, with a total of 64 flag bits, each flag bit corresponds to a register of one address, and a value of 1 indicates that the register has been written; in a WR_IRQ interrupt service, values of written registers are read by the control unit, processed and forwarded to the differential output unit to obtain the differential signals, and are transmitted to the differential column driver chips through the differential signals.

Optionally, the differential output unit has three instruction first input first outputs (FIFOs) with a depth of 4, and each FIFO is 16 bit in size; instruction data written by the control unit is cached in the FIFOs; when there is data in the FIFOs, first written 16 bit data is taken out of the FIFOs by the differential output unit and output to serial data out (SDO) ports for transmission to the differential column driver chips.

Optionally, the differential output unit reads the display data in the SRAM into data FIFOs; after outputting one unit instruction, data is read from the data FIFOs and sent to the differential column driver chips.

Optionally, the differential output unit includes an address pointer inside, pointing to SRAM cache 1 when resetting, and automatically incrementing after reading data; the address pointer is reset after receiving a VSYNC command from the parsing unit and switches to SRAM cache 0; and data is no longer read when the pointer exceeds a cache range.

Compared with the prior art, the disclosure has following beneficial effects.

According to the disclosure, a receiving module is added between column driver chips and a control card, and the receiving module receives commands and data sent by a single-ended signal control card, stores the commands and data in an SRAM of the receiving module, and sends the commands and data to differential column driver chips through differential signals. Due to the large number of differential column driver chips, the cost of SRAM and PLL among them is significantly saved, and the total cost after adding the receiving module is still lower than that of the traditional display system.

BRIEF DESCRIPTION OF THE DRAWINGS

In order to explain the technical scheme of the disclosure more clearly, the drawings needed in the embodiments will be briefly introduced below. Obviously, the drawings in the following description are only some embodiments of the disclosure, and for ordinary people in the field, other drawings may be obtained according to these drawings without paying creative labor.

DETAILED DESCRIPTION OF THE EMBODIMENTS

In the following, the technical scheme in the embodiment of the disclosure will be clearly and completely described with reference to the attached drawings. Obviously, the described embodiments are only a part of the embodiments of the disclosure, but not all the embodiments. Based on the embodiments in the disclosure, all other embodiments obtained by ordinary technicians in the field without creative labor belong to the scope of protection of the disclosure.

In order to make the above objectives, features and advantages of the disclosure more obvious and easier to understand, the disclosure will be further described in detail with the attached drawings and specific embodiments.

Embodiment 1

Figure 1:
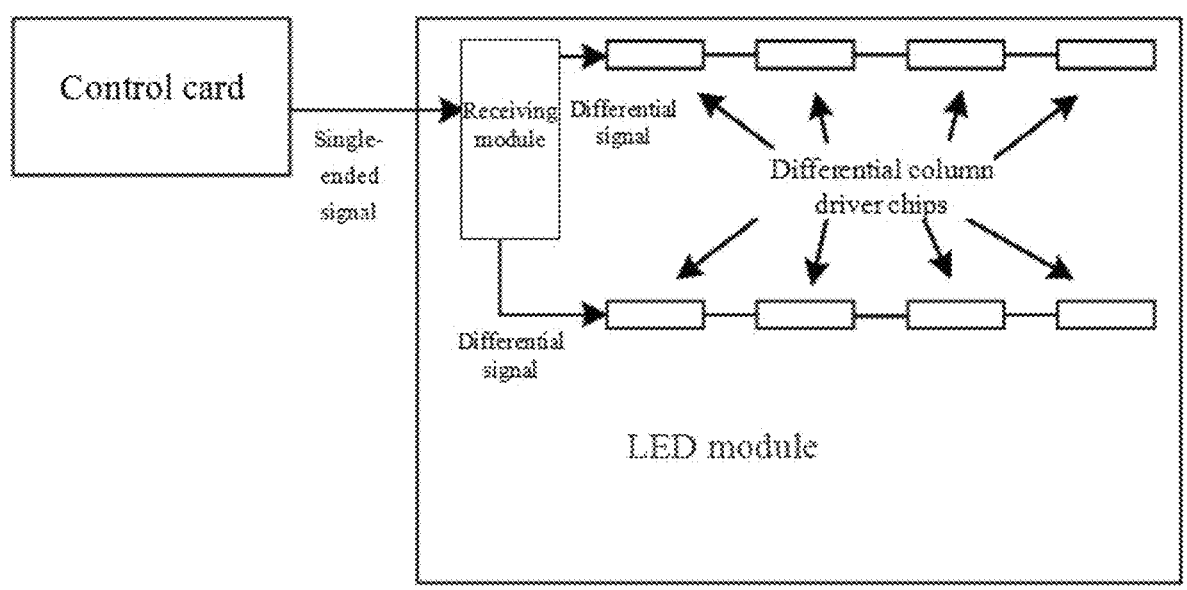
FIG. 1 is a schematic diagram showing compatibility between a control card and differential column driver chips by adding a receiving module.

As shown in FIG. 1, a receiving module is added between column driver chips and a control card, and the receiving module receives commands and data sent by a single-ended signal control card, stores the commands and data in an SRAM of the receiving module, and sends the commands and data to differential column driver chips through differential signals. Due to the large number of differential column driver chips, the cost of SRAM and PLL among them is significantly saved, so a total cost after adding the receiving module is still lower than that of the traditional display system. A specific implementation process of the receiving module is as follows.

Figure 2:
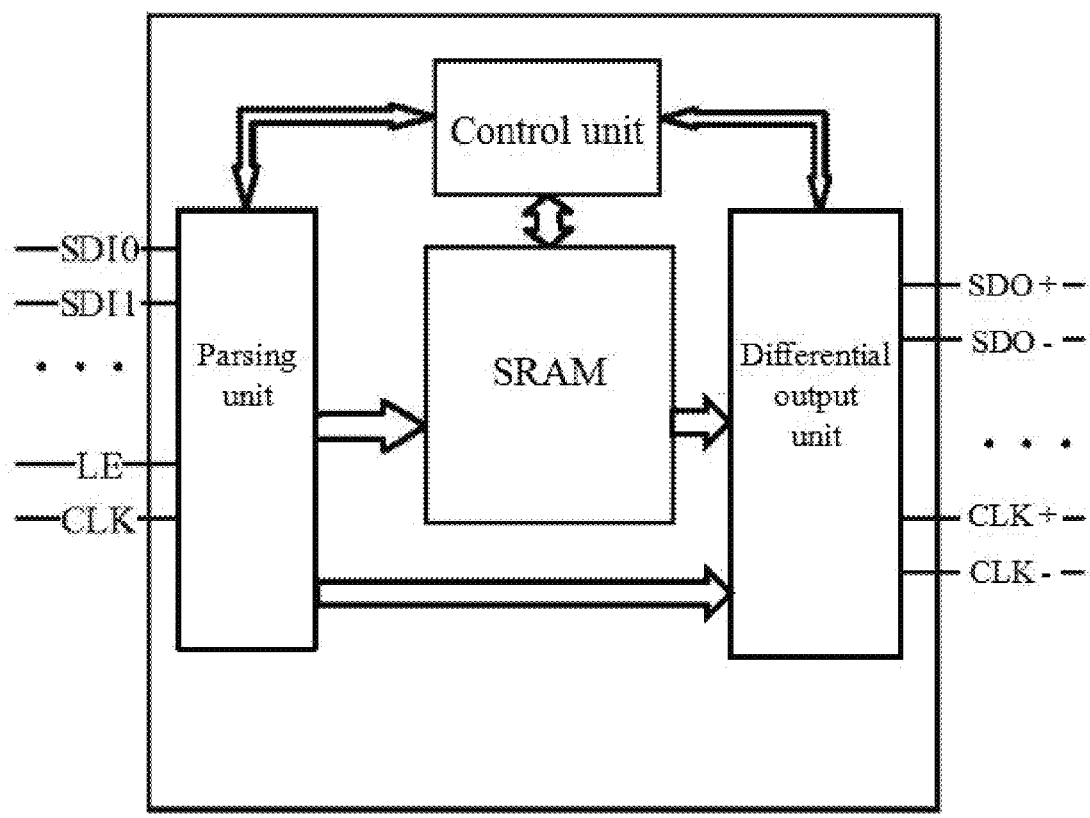
FIG. 2 is a schematic diagram of a device for receiving a single-ended signal of an LED control card and forwarding as differential signals.

As shown in FIG. 2, the disclosure provides a device for receiving a single-ended signal of an LED control card and forwarding as differential signals, including a parsing unit, a control unit, an SRAM and a differential output unit;

the parsing unit is respectively connected with the control unit, the SRAM and the differential output unit, the control unit is respectively connected with the SRAM and the differential output unit, and the SRAM is connected with the differential output unit;

the parsing unit is used for receiving and parsing data, latch and clock signals sent by the control card;

the SRAM is used for storing display data of a parsing result;

the control unit is used for processing commands of the parsing result, accessing the SRAM, modifying the display data transmitted by the parsing unit in the SRAM, and filling the SRAM for provision to a back end for output display; and the differential output unit is used for obtaining differential signals based on a processing result of the control unit.

Figure 3:
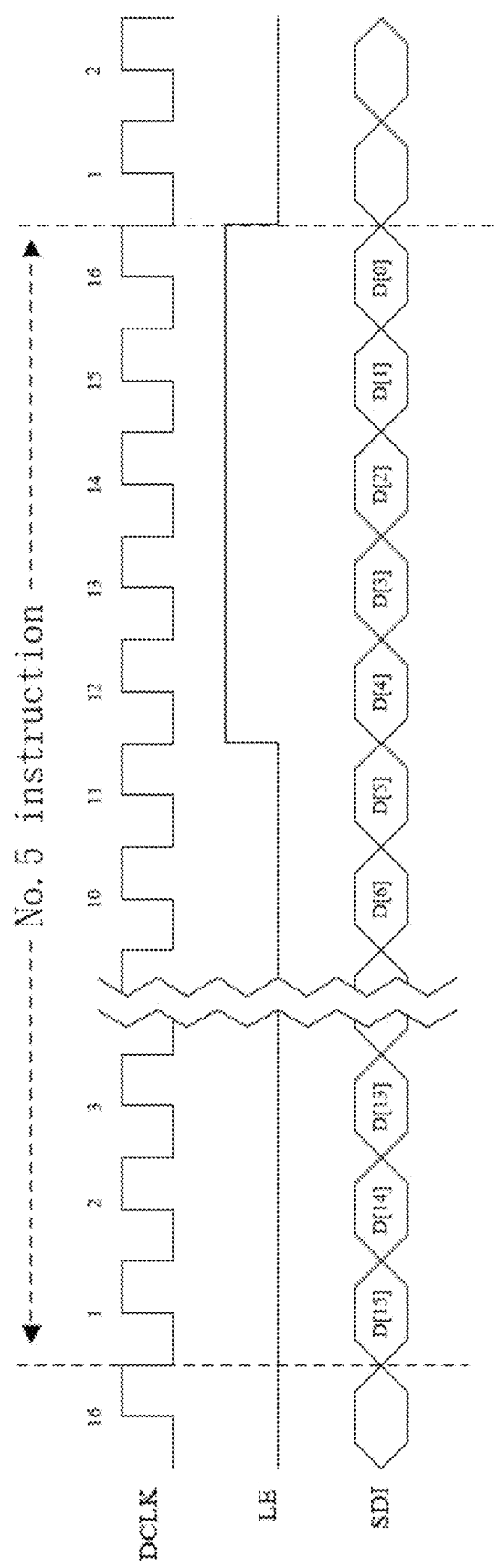
FIG. 3 is a schematic diagram of a control instruction issued by a control card according to the disclosure.

In this embodiment, the parsing unit uses a flat cable to connect the control card and the receiving module, and a total of eight signals are connected, including SDI0-SDI5, latch enable (LE) and data clock (DCLK), where the SDI0-5 are data lines, the DCLK is a clock line and the LE is a latch signal line. The parsing unit is responsible for receiving data, latch and clock signals sent by the control card, and parsing the data or commands sent by the control card: FIG. 3 below shows a control instruction sent by the control card: the DCLK has five rising edges when the latch enable (LE) is at a high level, which means the instruction is a No. 5 instruction. The parsing unit intercepts 16 bit data before a falling edge of the latch, assuming that the No. 5 instruction is a writing register instruction, where high 8 bits represent register addresses and low 8 bits represent values written into the registers; if a No. 1 instruction (including one rising edge of DCLK when LE is at a high level) is writing display data, 16 bit data of the instruction are all display data. Table 1 below is a command table corresponding to an LE length (including the number of DCLK).

TABLE 1

| Command name | LE length | Command description |
| --- | --- | --- |
| DATA_LATCH | 1 | Latching display data to SRAM |
| VSYNC | 3 | Displaying synchronization, and the instruction is directly sent to the differential output unit. |
| WR_REG | 5 | Writing register |
| SOFT_RST | 9 | Resetting |
| EN_OP | 11 | Enabling all outputs |
| DIS_OP | 12 | Disabling all outputs |
| PRE_ACT | 14 | Write enable |

Commands are fed back to the control unit, and the display data is stored in the SRAM. There are 6 data lines in total, which may receive in parallel, where SDI0-SDI2 are the first group of RGB data lines, respectively taking the data and commands of red (R), green (G) and blue (B) colors, and SDI3-SDI5 are the second group of RGB data lines. R, G and B receive different commands in parallel, but the first group and the second group of commands are the same; all 6 data lines may receive different data in parallel. Users may choose to enable one or two groups of data lines according to the application scenario.

The parsing unit divides the SRAM into two caches, and there is an address pointer inside the SRAM. When reset, the pointer points to 0, cache 0. When receiving a DATA_LATCH command, 16 bit*3 or 16 bit*6 pieces of data (depending on the number of enabled data groups) are written into corresponding addresses of the SRAM, and an address counter automatically increments by 6/12 bytes after writing the data. After receiving a VSYNC command, the address pointer is reset to 0, pointing to cache 1. Caches are written alternately, and no more writing is conducted when the caches are full.

Figure 4:
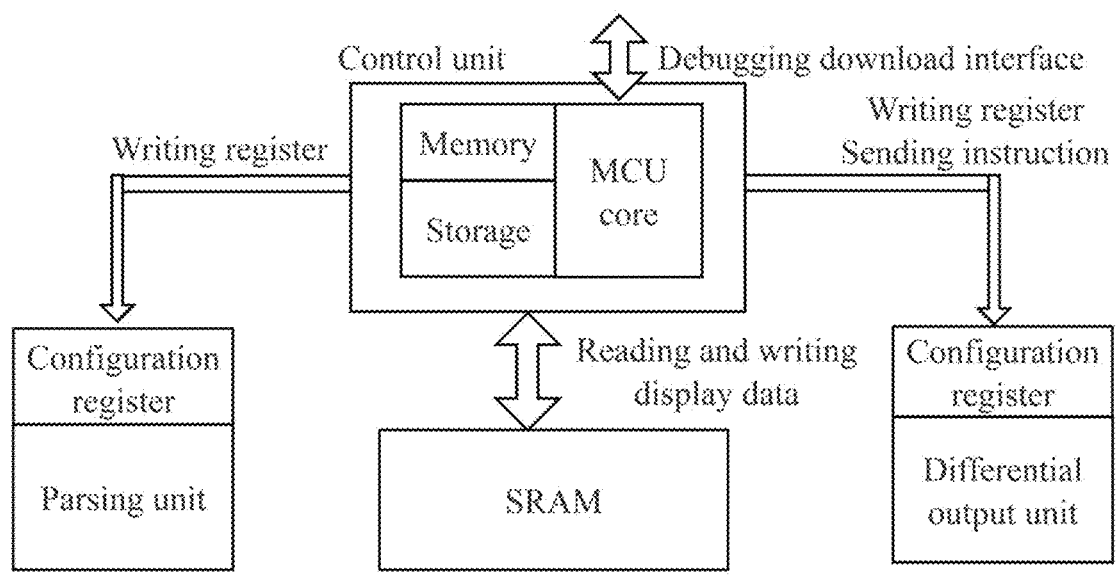
FIG. 4 is a schematic diagram of a working principle of a control unit according to the disclosure.
Figure 5:
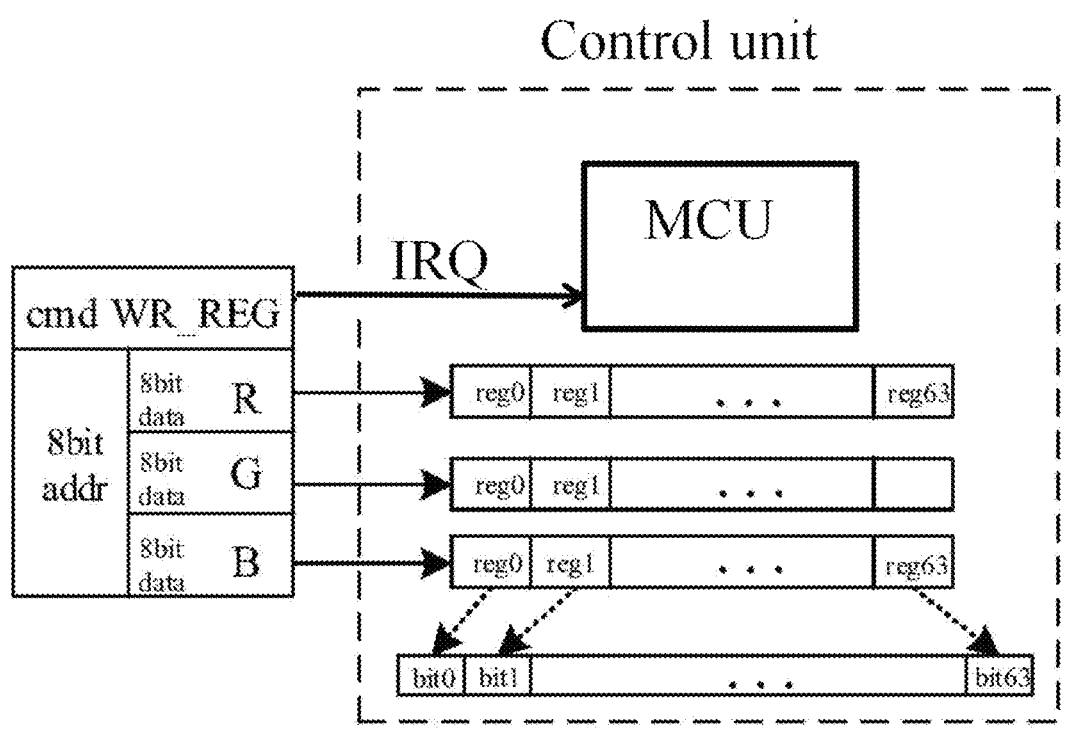
FIG. 5 is a schematic diagram of an internal structure of a control unit according to the disclosure.

In this embodiment, as shown in FIG. 4 and FIG. 5, the control unit is a microcontroller unit (MCU), which is programmable, may execute flexible software codes, and may upgrade the software and modify or update functions. The control unit may access the SRAM, modify the display data transmitted by the parsing unit in the SRAM to optimize the display effect, or fill the SRAM for provision to a back end for output display when there is no control card to send the display data, and may be used to test the function of the LED display screen without the control card.

The control unit includes three groups of registers, 64 in each group, and each register is 8 bit in size. When the parsing unit receives a PRE_ACT command and a WR_REG command, values are written into registers of corresponding addresses (the registers are written only after the PRE_ACT command is received, otherwise the writing will not succeed), and an interrupt (hereinafter referred to as WR_IRQ) to the MCU core will be generated during the writing. The control unit also has two 32 bit registers (hereinafter referred to as REG_SR registers) with a total of 64 flag bits, each of which corresponds to a register of one address. When a value is 1, it means that the register has been written (R, G and B share one bit). In a WR_IRQ interrupt service, values written into the registers are read by the MCU, processed and forwarded to the differential output unit, and are transmitted to the differential column driver chips through the differential signals, such as the following processing:

```
void WR_IRQ_Handler(void) {
If (get_REG_SR( )==14) {
Bright_R=read(REG_R[14]);
Bright_G=read(REG_G[14]);
Bright_B=read(REG_B[14]);
OutputUnit_Write(10, Bright_R, Bright_G, Bright_B);}}.
```

Reading the REG_SR registers in the WR_IRQ interrupt function, it is found that bit 14 is set to 1 (the register of address 14 is written), the original register of address 14 is used to control the output brightness of single-ended column driver chips, and a register that controls the brightness in the differential column driver chips is address 10, so the software reads the values of address 14 and allows the differential output unit write these values to the 10 register of the differential column driver chips.

Each command received by the parsing unit (except DATA_LATCH) corresponds to an interrupt, so the meanings of each command and each register may be highly customized by the software. This kind of high customization is needed because the instructions sent by the control card are adapted to the previous single-ended signal column driver chips, and the implementation mode and internal register function of the differential column driver chips are completely different, so the data values may not be simply forwarded. For example, enabling all output command (EN_OP) is realized by LE length in single-ended column driver, and no register value is written, but the command is realized by writing register values in differential column drivers, so MCU needs to realize the operation of writing register in EN_OP interrupt:

```
void EN_OP_Handler(void) {
OutputUnit_Write(0, CMD_EN_OP); //Let the differential output unit write an EN_OP command to register 0 of differential drivers}.
```

Figure 6:
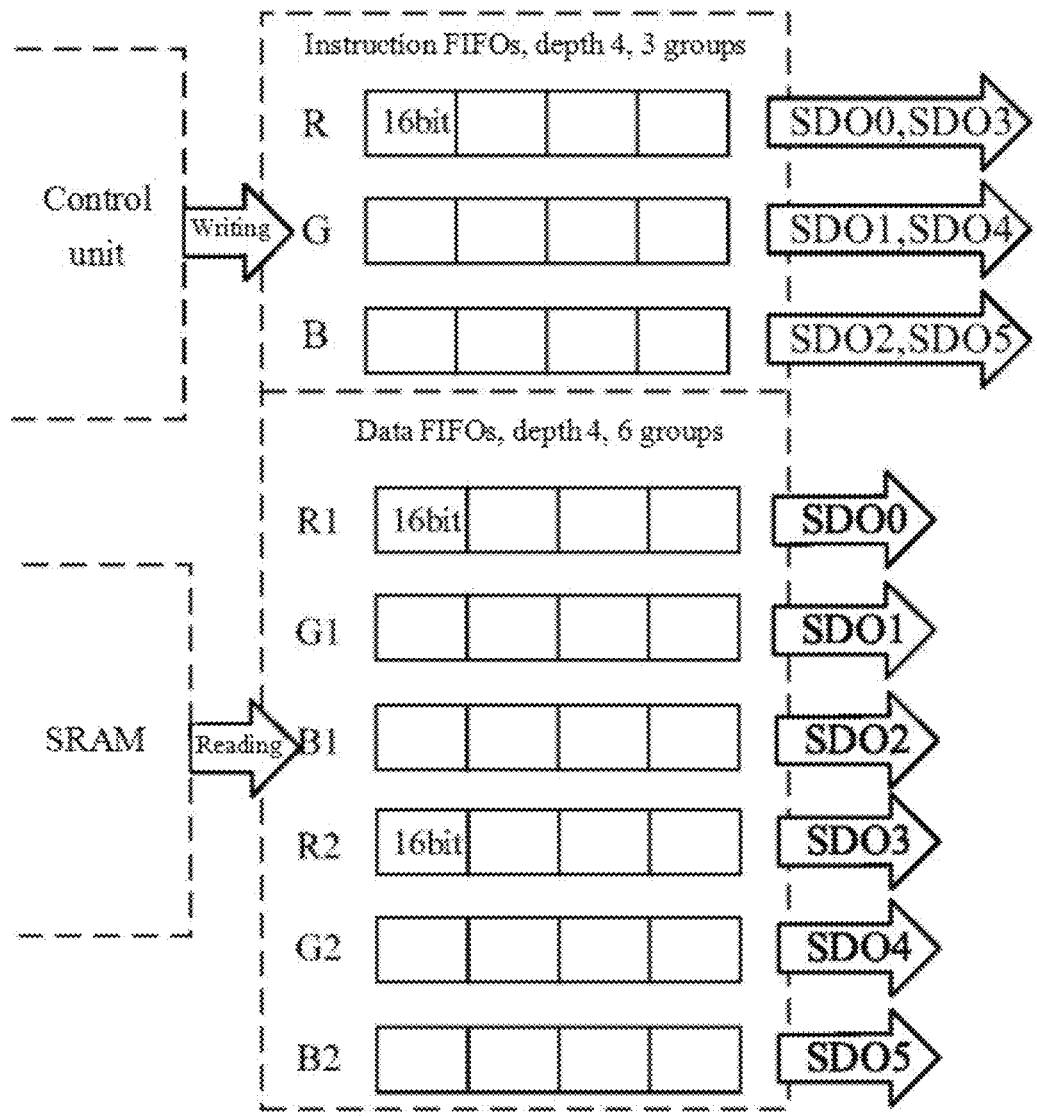
FIG. 6 is a schematic diagram of a working principle of a differential output unit according to the disclosure.

In this embodiment, as shown in FIG. 6, the differential output unit has three (R, G, B) instruction FIFOs with a depth of 4, and each FIFO is 16 bit in size (high 8 bits are target register addresses and low 8 bits are register values). Instruction data written by the control unit is cached in the FIFOs. When there is data in the FIFOs, the differential output unit takes out first written 16 bit data from the FIFOs, and outputs the first written 16 bit data to SDO ports for transmission to the differential column driver chips. Data of a first FIFO is output to SDO0/3 (SDO0 and SDO3 are both R signals with a same register instruction; when only one group of RGB output ports is enabled, SDO3 is invalid, as in the following SDO4 and 5), a second FIFO is output to SDO1/4, and a third FIFO is output to SDO2/5. The differential output unit outputs the instruction at the beginning of each frame displayed by the LED.

While outputting the instruction, the receiving module reads the display data in SRAM into data FIFOs, totaling 6 data FIFOs. When only one group of RGB output is enabled, only first three FIFOs are valid, and 6/12 bytes of data are read at a time (depending on how many groups of RGB are enabled) and written into each FIFO respectively. After outputting one unit instruction, data is read from the data FIFO and sent to the differential column driver chips. The differential output unit also has an internal address pointer that points to SRAM cache 1 at reset and automatically increments after reading data. The address pointer is reset upon receipt of a VSYNC command from the parsing unit and switches to SRAM cache 0. Data is no longer read when the pointer exceeds the cache range.

Figure 7:
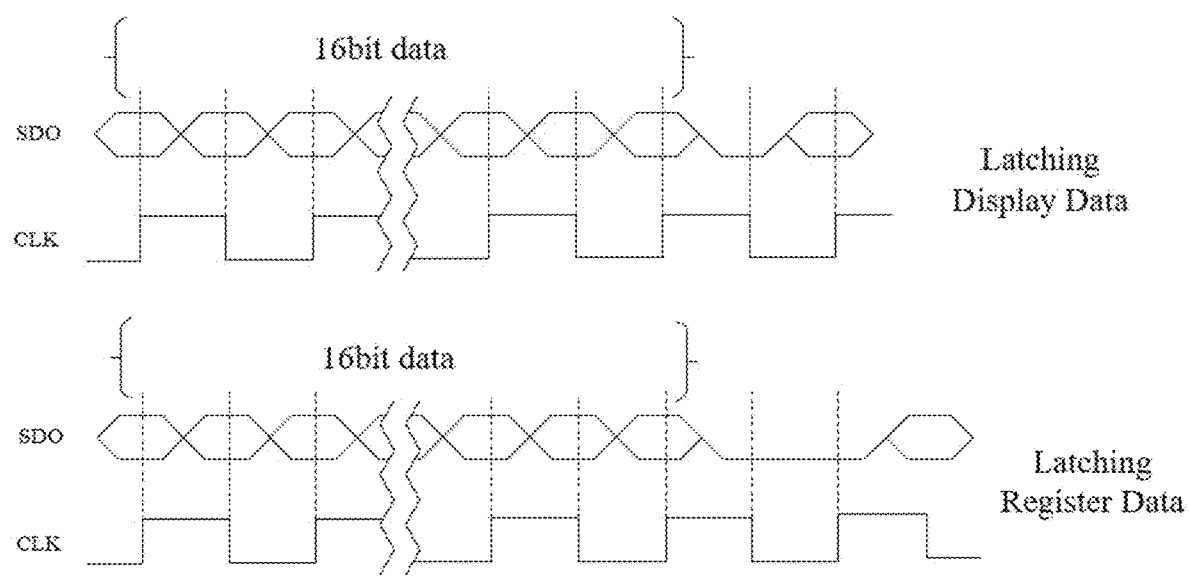
FIG. 7 is a schematic diagram of a working principle of differential output signals according to the disclosure.

As shown in FIG. 7, there are a total of 7 channels of differential output signals, SDO0-SDO5 and a CLK (clock is double edge), where SDO0-2 are the first group of RGB signals and SDO3-5 are the second group of RGB signals. Each channel of signals needs two lines + and − to form differential signals. When + voltage is greater than − voltage, it means transmission of 1, which is equivalent to high level of the single-ended signal. When − voltage is greater than + voltage, it means transmission of 0, which is equivalent to low level. On the SDO line, if the + voltage and the − voltage are equal, it means latching. The latching takes two cycles to latch the data into the control register of the column driver chips, and the latching takes one cycle to latch the data as display data.

According to the disclosure, the receiving module is added between the single-ended signal control card and the differential signal column driver chips, the chips may be made by advanced technology, and the cost is controllable. Due to the huge number of column driver chips, the total cost of using the receiving chip + differential column driver chips is still lower than that of using the common driver, so that the cost may be saved and the existing control card scheme may be compatible. Moreover, the frequency of the differential signal is higher than the frequency multiplied by the PLL, so the display refreshing effect may be achieved by using the receiving module and the differential driver chips. In addition, after using the receiving module, the display function test and color correction of the LED module may be carried out in the off-line (not connected to the control card) state, thus reducing the test steps and costs of LED manufacturers.

The above-mentioned embodiment is only a description of the preferred mode of the disclosure, and does not limit the scope of the disclosure. Under the premise of not departing from the design spirit of the disclosure, various modifications and improvements made by ordinary technicians in the field to the technical scheme of the disclosure shall fall within the protection scope determined by the claims of the disclosure.

What is claimed is:

1. A device for receiving a single-ended signal of an LED control card and forwarding as differential signals, comprising: a parsing unit, a control unit, an SRAM and a differential output unit; wherein
the parsing unit is respectively connected with the control unit, the SRAM and the differential output unit, the control unit is respectively connected with the SRAM and the differential output unit, and the SRAM is connected with the differential output unit;

the parsing unit is used for receiving and parsing data, latch and clock signals sent by the control card;

the SRAM is used for storing display data of a parsing result;

the control unit is used for processing commands of the parsing result, accessing the SRAM, modifying the display data transmitted by the parsing unit in the SRAM, and filling the SRAM for provision to a back end for output display;

the control unit accesses the SRAM, modifies the display data transmitted by the parsing unit in the SRAM to optimize a display effect, or fills the SRAM for the provision to the back end for the output display when there is no control card to send the display data, and is used to test a function of an LED display screen without the control card; and the differential output unit is used for obtaining the differential signals based on a processing result of the control unit;

the control unit comprises three groups of registers, 64 in each group, and each register is 8 bit in size; when the parsing unit receives a PRE_ACT command and a WR_REG command, values are written into registers of corresponding addresses, and the registers are written only after receiving the PRE_ACT command, otherwise a writing is not succeed, and an interrupt WR_IRQ is generated to an MCU core during the writing;

in a WR_IRQ interrupt service, the values written into the registers are read by the control unit, processed and forwarded to the differential output unit, and are transmitted to the differential column driver chips through the differential signals;

the differential output unit has three instruction FIFOs of R, G and B with a depth of 4, and each FIFO is 16 bit in size, wherein high 8 bits are target register addresses and low 8 bits are register values; instruction data written by the control unit is cached in the FIFOs; when there is data in the FIFOs, first written 16 bit data is taken out of the FIFOs by the differential output unit and output to SDO ports for transmission to the differential column driver chips;

while outputting an instruction, a module reads the display data in the SRAM into data FIFOs; and there are 7 channels of differential output signals in total, SDO0-5, and a CLK clock with double edges, wherein SDO0-2 are a first group of RGB signals and SDO3-5 are a second group of RGB signals; and each signal needs two lines of + and − to form differential signals.

2. The device for receiving the single-ended signal of the LED control card and forwarding as the differential signals according to claim 1, wherein the parsing unit divides the SRAM into two caches, and there is an address pointer inside the SRAM, pointing to 0, cache 0 when resetting; when receiving a DATA_LATCH command, 16 bit*3 or 16 bit*6 pieces of data are written to corresponding addresses of the SRAM, and an address counter automatically increments by 6/12 bytes after writing the data; after a VSYNC command is received, the address pointer is reset to 0, pointing to cache 1; caches are written alternately, and no more writing when the caches are full.

3. The device for receiving the single-ended signal of the LED control card and forwarding as the differential signals according to claim 1, wherein there is an address pointer inside the differential output unit, pointing to SRAM cache 1 when resetting, and automatically incrementing after reading data; the address pointer is reset after receiving a VSYNC command sent by the parsing unit and switched to SRAM cache 0; and data is no longer read when the pointer exceeds a cache range.

* * * * *